United States Patent
Jeong et al.

(10) Patent No.: US 9,059,112 B1
(45) Date of Patent: Jun. 16, 2015

(54) DISPLAY DEVICE AND MANUFACTURING METHOD THEREOF

(71) Applicant: Samsung Display Co., Ltd., Yongin, Gyeonggi-Do (KR)

(72) Inventors: Yeon Taek Jeong, Seoul (KR); Hee Jun Byeon, Suwon-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/253,040

(22) Filed: Apr. 15, 2014

(30) Foreign Application Priority Data

Dec. 6, 2013 (KR) ........................ 10-2013-0151802

(51) Int. Cl.
*H01L 23/58* (2006.01)
*H01L 21/66* (2006.01)
*H01L 27/12* (2006.01)

(52) U.S. Cl.
CPC .............. *H01L 22/32* (2013.01); *H01L 27/124* (2013.01); *H01L 27/1259* (2013.01)

(58) Field of Classification Search
CPC .......................... H01L 22/34; H01L 21/67242
USPC ......................... 257/43, 48, 59, 72
See application file for complete search history.

(56) References Cited

U.S. PATENT DOCUMENTS

| 6,566,902 B2 | 5/2003 | Kwon et al. |
| 7,649,586 B2 | 1/2010 | Kim et al. |
| 7,956,945 B2 | 6/2011 | Kim |
| 2008/0224125 A1 | 9/2008 | Tanabe et al. |

FOREIGN PATENT DOCUMENTS

| JP | 2004-272028 A | 9/2004 |
| JP | 2012-014098 A | 1/2012 |
| JP | 4947801 B2 | 3/2012 |
| KR | 100656900 B1 | 12/2006 |
| KR | 101107708 B1 | 1/2012 |

*Primary Examiner* — Tan N Tran
(74) *Attorney, Agent, or Firm* — Cantor Colburn LLP

(57) ABSTRACT

A display device includes a first insulating substrate including a display area, a peripheral area and a test area, a gate conductor including a test element group gate electrode, a gate electrode and a gate line on the first insulating substrate, a gate insulating layer on the gate conductor, a semiconductor layer including a test element group semiconductor layer and a pixel semiconductor layer on the gate insulating layer, a data conductor including a test element group source electrode, a test element group drain electrode, a data line including a source electrode, and a drain electrode on the semiconductor layer, a first passivation layer on the data conductor, a test element group common electrode and a pixel common electrode on the first passivation layer, a second passivation layer on the test element group common electrode and the pixel common electrode, and a pixel electrode on the second passivation layer.

20 Claims, 14 Drawing Sheets

DISPLAY DEVICE AND MANUFACTURING METHOD THEREOF

This application claims priority to Korean Patent Application No. 10-2013-0151802 filed on Dec. 6, 2013, and all the benefits accruing therefrom under 35 U.S.C. §119, the entire contents of which are incorporated herein by reference.

BACKGROUND (a) Field

The invention relates to a display device and a manufacturing method thereof (b) Description of the Related Art As a display device, a flat panel display may be used. The flat panel display includes a liquid crystal display ("LCD"), an organic light emitting diode display ("OLED"), a plasma display, an electrophoretic display, and an electrowetting display, for example.

Among the various flat panel displays, an LCD is one of the flat panel displays which have been most widely used and generally includes two sheets of display panels in which field generating electrodes, such as a pixel electrode and a common electrode, are formed and a liquid crystal layer interposed therebetween. The LCD further includes a backlight unit which provides light to the display panels having the liquid crystal layer interposed therebetween. The LCD displays an image by applying a voltage to the field generating electrode to generate an electric field in the liquid crystal layer, determining an orientation of liquid crystal molecules of the liquid crystal layer based on the generated electric field, and controlling emission of light provided by the backlight unit.

Generally, the display device including the LCD includes a thin film transistor ("TFT") array panel. The TFT array panel includes a gate electrode which is a portion of a gate wire, a semiconductor layer providing a channel, and a source electrode which is a portion of a data wire and a drain electrode. A TFT is a switching element which transfers or blocks an image signal transferred through the data wire to or from the pixel electrode depending on a scanning signal transferred through the gate wire.

To confirm whether progress results of each of the processes in a process of manufacturing a display device are correct, a thickness, a resistance, a concentration, a pollution level, and a critical dimension of results of each process, electrical characteristics of elements, and the like are measured. Since it is likely to damage elements during the measuring process, there is a case in which an actual substrate may not be monitored during the process.

In this case, a pattern called a test element group ("TEG") is formed in a specific portion of the substrate on which the elements are formed or a separate test area to perform processes on the substrate on which the actual elements are formed and measure the TEG, thereby evaluating the corresponding processes and the characteristics of the elements.

SUMMARY

The invention has been made in an effort to provide a display device and a manufacturing method thereof capable of evaluating characteristics of elements included in the display device without disassembling the display device by improving performance and reliability of a test element group ("TEG") element evaluating characteristics of elements.

An exemplary embodiment of the invention provides a display device, including a first insulating substrate including a display area, a peripheral area, and a test area, a gate conductor including a TEG gate electrode, a gate electrode, and a gate line which are disposed on the first insulating substrate, a gate insulating layer disposed on the gate conductor, a semiconductor layer including a TEG semiconductor layer and a pixel semiconductor layer which are disposed on the gate insulating layer, a data conductor including a TEG source electrode, a TEG drain electrode, a source electrode, a drain electrode, and a data line which are disposed on the semiconductor layer, a first passivation layer disposed on the data conductor, a TEG common electrode and a pixel common electrode which are disposed on the first passivation layer, a second passivation layer disposed on the TEG common electrode and the pixel common electrode, and a pixel electrode disposed on the second passivation layer.

In an exemplary embodiment, the gate electrode, the pixel semiconductor layer, the source electrode, and the drain electrode may provide a pixel thin film transistor ("TFT"), the TEG gate electrode, the TEG semiconductor layer, the TEG source electrode, and the TEG drain electrode may provide a TEG thin film transistor ("TFT"), and the TEG TFT and the TEG common electrode may provide a TEG pattern.

In an exemplary embodiment, the pixel TFT may be located in the display area which displays an image and the TEG TFT may be located in the test area which is located around the display area.

In an exemplary embodiment, the TEG pattern may be provided in plural and the plurality of TEG patterns may be connected to each other through a TEG connection part which connects neighboring TEG common electrodes of the TEG pattern.

In an exemplary embodiment, the gate conductor may further include a common voltage line and the pixel common electrode and the TEG common electrode may be electrically connected to the common voltage line.

In an exemplary embodiment, the display device may further include a main connection part connecting the pixel common electrode to the TEG common electrode.

In an exemplary embodiment, the display device may further include a bridge disposed on the second passivation layer, in which the bridge may contact the TEG common electrode and the common voltage line.

In an exemplary embodiment, the display device may further include a first alignment layer disposed on the pixel electrode, in which the first alignment layer includes a rubbed portion.

In an exemplary embodiment, the display device may further include a separation line between the test area in which the TEG TFT is located and the peripheral area, at which the test area is removed to maintain a portion of the main connection part connecting the TEG common electrode to the display area or the peripheral area may remain.

Another exemplary embodiment of the invention provides a manufacturing method of a display device, including providing a gate conductor including a gate electrode, a TEG gate electrode, and a gate line on a first insulating substrate including a display area, a peripheral area, and a test area, stacking a gate insulating layer on the gate conductor, providing a TEG semiconductor layer and a pixel semiconductor layer on the gate insulating layer, providing a data conductor including a TEG source electrode, a TEG drain electrode, a source electrode, a drain electrode, and a data line on the TEG semiconductor layer and the pixel semiconductor layer, stacking a first passivation layer on the data conductor, providing a TEG common electrode and a pixel common electrode on the first passivation layer, stacking a second passivation layer on the TEG common electrode and the pixel common electrode, and providing a pixel electrode on the second passivation layer.

In an exemplary embodiment, the TEG gate electrode, the TEG semiconductor layer, the TEG source electrode, and the TEG drain electrode may provide a TEG TFT, the gate electrode, the pixel semiconductor layer, the source electrode, and the drain electrode may provide a pixel TFT, and the TEG TFT and the TEG common electrode may provide a TEG pattern, and the TEG pattern may be provided in plural.

In an exemplary embodiment, the plurality of TEG patterns may be connected to each other through a TEG connection part which connects the neighboring TEG common electrodes.

In an exemplary embodiment, the manufacturing method of a display device may further include providing a main connection part connecting the pixel common electrode to the TEG common electrode.

In an exemplary embodiment, the gate conductor may be provided to further include a common voltage line and the pixel common electrode and the TEG common electrode may be electrically connected to the common voltage line.

In an exemplary embodiment, a bridge is further provided in the providing the pixel electrode, in which the bridge may contact the TEG common electrode and the common voltage line.

In an exemplary embodiment, the plurality of TEG patterns may be spaced apart from each other at a predetermined distance.

In an exemplary embodiment, the manufacturing method of a display device may further include removing the test area at a separation line between the test area and the peripheral area where the pixel TFT may be located in the display area which displays an image and the TEG pattern may be located in the test area which is disposed around the display area and the test area may be removed.

In an exemplary embodiment, in the removing the test area, a portion of the main connection part connecting the TEG common electrode to the display area or the peripheral area may remain.

In an exemplary embodiment, the manufacturing method of a display device may further include applying and rubbing an alignment layer on the pixel electrode.

In an exemplary embodiment, the providing a TEG semiconductor layer and a pixel semiconductor layer on the gate insulating layer and the providing a data conductor including a TEG source electrode, a TEG drain electrode, a source electrode, a drain electrode, and a data line on the TEG semiconductor layer and the pixel semiconductor layer may be performed using a single mask.

According to the display device as described above, it is possible to evaluate the characteristics of the elements after the rubbing of the liquid crystal without disassembling the display device. Therefore, it is possible to provide the display device including the elements with the improved reliability and effectively reduce the time and costs required to evaluate the display device.

BRIEF DESCRIPTION OF THE DRAWINGS

The above and other exemplary embodiments, advantages and features of this disclosure will become more apparent by describing in further detail exemplary embodiments thereof with reference to the accompanying drawings, in which.

DETAILED DESCRIPTION

Figure 1:
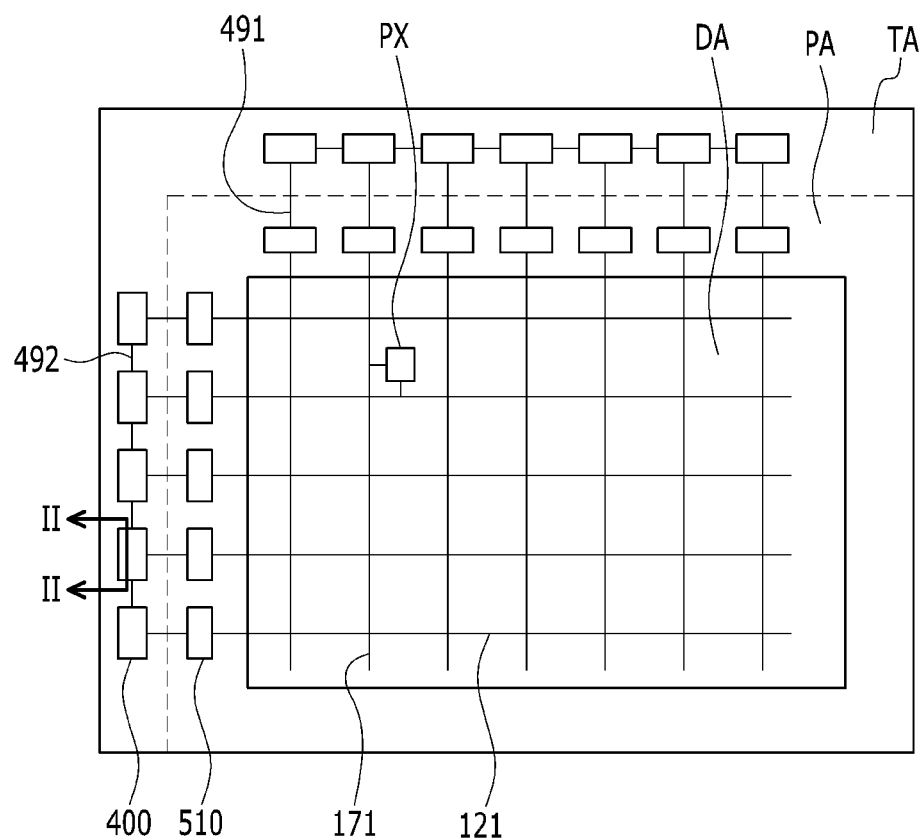
FIG. 1 is a conceptual view of an exemplary embodiment of a display device according to the invention.

The invention will be described more fully hereinafter with reference to the accompanying drawings, in which exemplary embodiments of the invention are shown. As those skilled in the art would realize, the described exemplary embodiments may be modified in various different ways, all without departing from the spirit or scope of the invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising" will be understood to imply the inclusion of stated elements but not the exclusion of any other elements.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Figure 2:
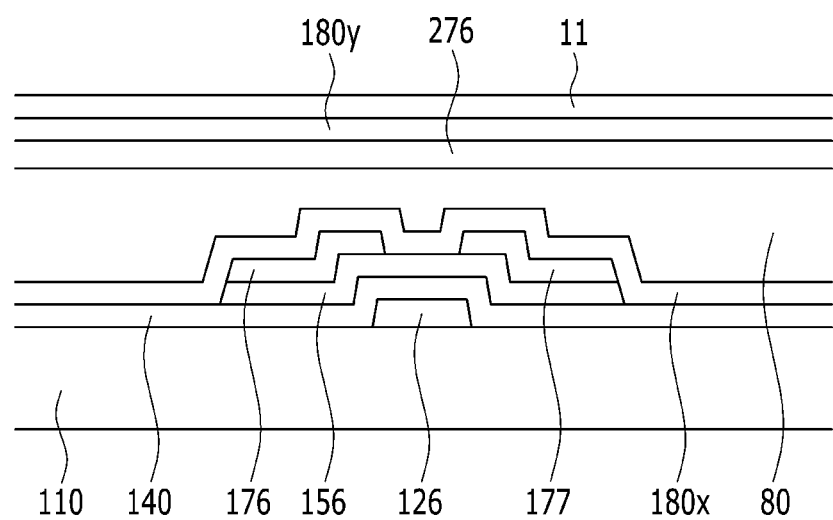
FIG. 2 is a cross-sectional view of an exemplary embodiment of a test element group ("TEG") thin film transistor ("TFT") according to the invention.
Figure 3:
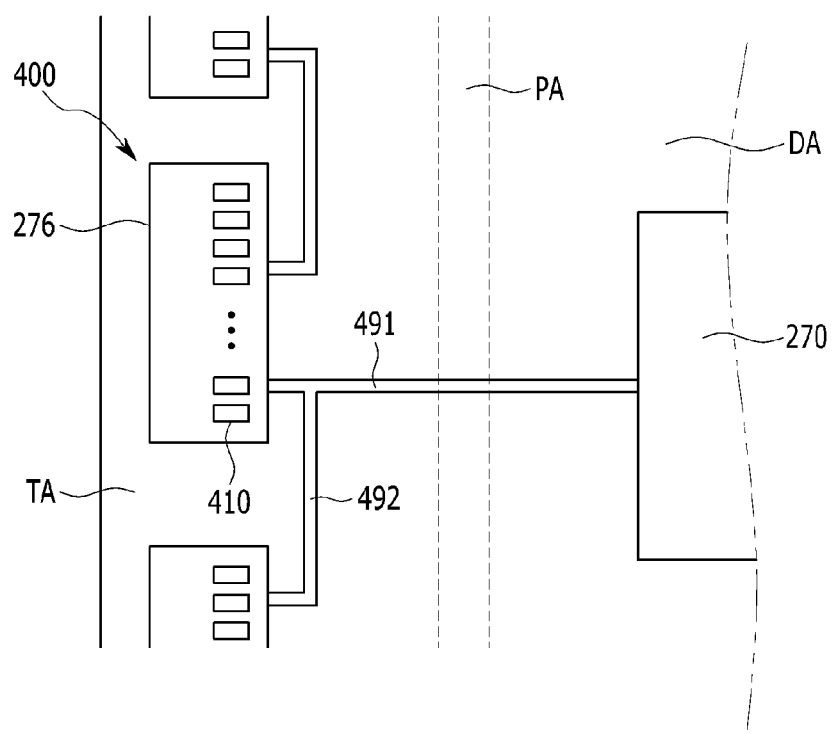
FIG. 3 is an enlarged view of the exemplary embodiment of a portion of the display device according to the invention.

First, a display device according to an exemplary embodiment of the invention will be described with reference to FIGS. 1 to 7. FIG. 1 is a conceptual view of a display device according to an exemplary embodiment of the invention, FIG. 2 is a cross-sectional view taken along line II-II of FIG. 1, and FIG. 3 is an enlarged view of a portion of the display device according to the exemplary embodiment of the invention.

Referring to FIG. 1, the display device according to the exemplary embodiment of the invention includes a display area DA displaying an images and a peripheral area PA located around the display area. In this case, the display device may further include a test area TA in which a plurality of test element group ("TEG") pattern parts are provided, in addition to the peripheral area PA in which a wiring, and the like is provided. The test area TA may be removed during a manufacturing process of the display device. FIG. 1 illustrates a dotted line between the test area TA and the peripheral area PA along which a substrate is cut by a laser and the like, to remove the test area TA.

The display area DA is provided with a plurality of gate lines 121 and a plurality of data lines 171 which intersect each other and are insulated from each other. A plurality of pixels PXs may be arranged in a matrix form by a plurality of signal lines including a plurality of gate lines 121 and a plurality of data lines 171. However, the invention is not limited thereto, and the plurality of pixels PXs may not be arranged in a matrix form by the plurality of signal lines including the plurality of gate lines 121 and the plurality of data lines 171.

The peripheral area PA may be provided with a plurality of signal lines 510 which extend from the gate lines 121 and the data lines 171 in the display area DA and the signal lines extended from the gate lines 121 or the data lines 171 may be connected to a driving unit (not illustrated) in which is located in the peripheral area PA.

A signal controller (not illustrated) generates a gate control signal, a data control signal, and a digital image signal and then transfers the gate control signal to a gate driver and the data control signal and the digital image signal to a data driver to control the gate driver and the data driver.

The gate driver is connected to the gate line 121. The gate driver applies a gate signal including a combination of gate-on voltage Von and gate-off voltage to the gate line 121 depending on the gate control signal from the signal controller (not illustrated).

The data driver is connected to the data line 171. The data driver receives the data control signal and the digital image signal for the pixels PXs of one row from the signal controller and selects a gray voltage corresponding to each of the digital image signals to convert the digital image signals into analog data signals and apply the converted analog data signals to the corresponding data lines 171.

A switching element is turned on when the gate-on voltage Von is applied to the gate line 121 connected to the switching element, and the data signal applied to the data line 171 is applied to the corresponding pixel PX through the turned on switching element.

Driving apparatuses, such as the gate and data drivers and the signal controller (not illustrated), may be directly mounted in the peripheral area PA of a display panel in at least one integrated circuit chip or mounted on a flexible printed circuit film (not illustrated) to be attached to the peripheral area PA in a tape carrier package ("TCP") or mounted on a separate printed circuit board ("PCB") (not illustrated).

Referring to FIG. 1, the test area TA is provided with at least one TEG pattern 400. In the illustrated exemplary embodiment, the TEG pattern 400 is located only at the top and left of the display device, but the invention is not limited thereto, and the TEG pattern 400 may be removed in at least one of the top, bottom, left, and right portions of the display area DA. In an exemplary embodiment, the TEG pattern 400 may be located in any area enclosing a circumference of the display area DA.

The TEG pattern 400 may be connected to the driver through a connection wiring but is not limited thereto, and may be directly connected to the pixel PX, which is located in the display area DA, through a main connection part 491.

The plurality of TEG patterns 400 may be located to be spaced apart from each other at a predetermined distance and the neighboring TEG patterns 400 may be connected to each other through a TEG connection part 492. This will be described below.

The one TEG pattern 400 may include a plurality of TEG thin film transistors ("TFTs") 410 (refer to FIG. 3) and may be provided along with a manufacturing process of a pixel TFT which is located in the display area, such that the TEG pattern 400 may serve to evaluate performance of the pixel TFT. That is, instead of the pixel TFT which is located in the display area DA, the TEG TFT 410 of the TEG pattern 400 which is located in the test area TA may be evaluated. By doing so, it is possible to provide the display device having more excellent performance and characteristics and it is possible to evaluate the performance and characteristics of the display device with a simple process and low cost.

FIG. 2 illustrates a cross section of the one TEG TFT included in the TEG pattern 400 illustrated in FIG. 1.

The TEG TFT includes a plurality of TEG gate electrodes 126 provided simultaneously with a gate conductor on a first insulating substrate 110.

A gate insulating layer 140 is disposed on the TEG gate electrode 126. In an exemplary embodiment, the gate insulating layer 140 may include inorganic insulating materials, and the like, such as silicon nitride (SiNx) and silicon oxide (SiOx).

A plurality of TEG semiconductor layers 156 is disposed on the gate insulating layer 140. In an exemplary embodiment, the TEG semiconductor layer 156 may be disposed only on the TEG gate electrode 126. In this case, the TEG semiconductor layer 156 may include a material including an oxide semiconductor.

A plurality of ohmic contacts (refer to FIG. 5) may be disposed on the TEG semiconductor layer 156. In an exemplary embodiment, the ohmic contacts may be provided as a pair, facing each other with reference to the TEG gate electrode 126 and disposed on the TEG semiconductor layer 156. In an exemplary embodiment, the ohmic contact may include a material such as n+ hydrogenated amorphous silicon doped with high-concentration n-type impurity such as phosphorous or may include silicide. However, when the TEG semiconductor layer 156 includes the oxide semiconductor, the ohmic contact may be omitted.

The data conductor including a plurality of TEG source electrodes 176 and a plurality of TEG drain electrodes 177 is disposed on the TEG semiconductor layer 156. In an exemplary embodiment, the TEG drain electrode 177 may include a bar-shaped end facing the TEG source electrode 176 with reference to the TEG gate electrode 126 and the other end with a wide area, but is not limited thereto.

The TEG gate electrode 126, the TEG source electrode 176, and the TEG drain electrode 177 provide a TEG TFT which is a switching element, along with the TEG semiconductor layer 156. The semiconductor layer 156 may have substantially the same plane shape with the TEG drain electrode 177 and the ohmic contact which is disposed under the TEG drain electrode 177, except for the area in which the TEG TFT is disposed.

A first passivation layer 180x is disposed on the data conductors 176 and 177 and the exposed TEG semiconductor layer 156, and may include an organic insulating material, an inorganic insulating material, or the like.

Further, referring to FIG. 2, an organic insulating layer 80 may be disposed on the first passivation layer 180x, but the invention is not limited thereto, and the organic insulating layer 80 may be omitted in another exemplary embodiment of the invention.

A plurality of TEG common electrodes 276 is disposed on the organic insulating layer 80. The TEG common electrode 276 may include transparent conductive materials, such as indium tin oxide ("ITO") and indium zinc oxide ("IZO"), for example. The TEG common electrode 276 of a planar type is disposed on the whole plane of the TEG pattern 400 and may cover the plurality of TEG TFTs included in the TEG pattern 400.

As described above, the plurality of TEG TFTs 410 and TEG common electrodes 276 provide one TEG pattern 400. In an exemplary embodiment, the TEG pattern 400 may be provided in plural, spaced apart from each other at a predetermined distance as illustrated in FIG. 1.

As described above, the TEG pattern 400 is provided by the same process as the process which is applied to the TFT and the like within the pixel provided in the display area DA.

Referring to FIG. 3, the one TEG pattern 400 includes the plurality of TEG TFTs 410 and includes one TEG common electrode 276 to cover the plurality of TEG TFTs 410.

The plurality of TEG patterns 400 may be connected to each other by a TEG connection part 492. In particular, the TEG connection part 492 may connect between the TEG common electrodes 276 included in each of the TEG patterns 400. In this case, the TEG connection part 492 may be provided along with the TEG common electrode 276. That is, the TEG connection part 492 may include the same material as the TEG common electrode 276 and the TEG connection part 492 and the TEG common electrode 276 may be disposed in the same layer.

Further, the pixel common electrode 270 may be disposed in the same layer as the TEG common electrode 276 and the pixel common electrode 270 and the TEG common electrode 276 may be simultaneously provided. In particular, the pixel common electrode 270 and the TEG common electrode 276 may be connected to each other through the main connection part 491. The main connection part 491 may also be provided along with the pixel common electrode 270 and the TEG common electrode 276 and the main connection part 491, the pixel common electrode 270, and the TEG common electrode 276 may include the same material.

That is, as illustrated in FIG. 3, the main connection part 491 connects the pixel common electrode 270 to the TEG common electrode 276 in the same layer, the pixel common electrode 270 is connected to a common voltage line 131 through a contact hole 184 (refer to FIG. 4), and the TEG common electrode 276 may also be electrically connected to the common voltage line 131.

A second passivation layer 180y may be disposed on the TEG common electrode 276. The second passivation layer 180y may include an organic insulating material, an inorganic insulating material, or the like. Further, a first alignment layer 11 may be disposed on the second passivation layer 180y.

Referring to FIG. 3, the substrate may be cut along the dotted line between the test area TA and the peripheral area PA by a laser and the like, to remove the test area TA. When the test area TA is removed, the main connection part 491 and the TEG pattern 400 located in the test area are removed and a portion of the main connection part 491 located in the display area or the peripheral area may remain in the display device.

The plurality of TEG patterns 400 are provided by the same process as the process which is applied to the pixel TFT located in the display area DA to be described below. In this case, a performance of the pixel TFT included in the display device may be evaluated by evaluating the TEG pattern 400.

In an exemplary embodiment, the TEG pattern 400 includes the TEG common electrode 276, thereby preventing a reduction in performance due to static electricity which may occur during the process.

Figure 4:
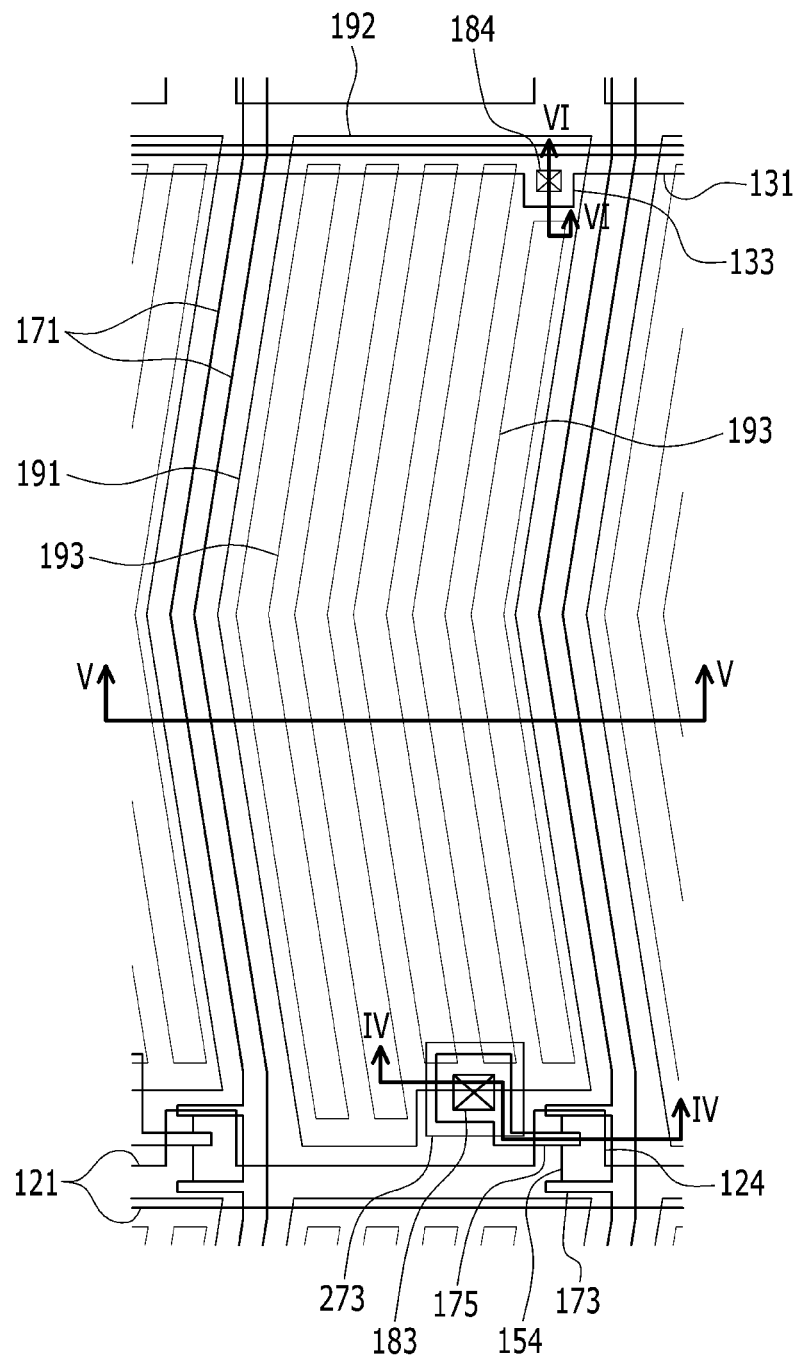
FIG. 4 is a plan view of the exemplary embodiment of one pixel of the display device according to the invention.
Figure 5:
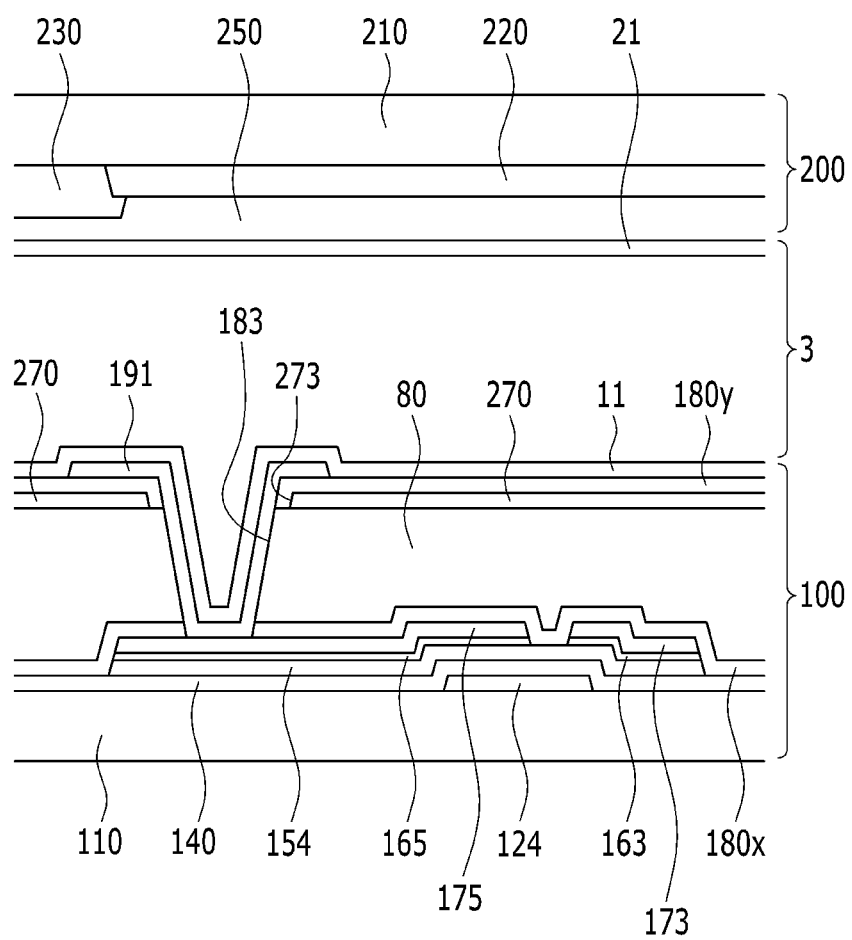
FIG. 5 is a cross-sectional view of the display device taken along line IV-IV of FIG. 4.
Figure 6:
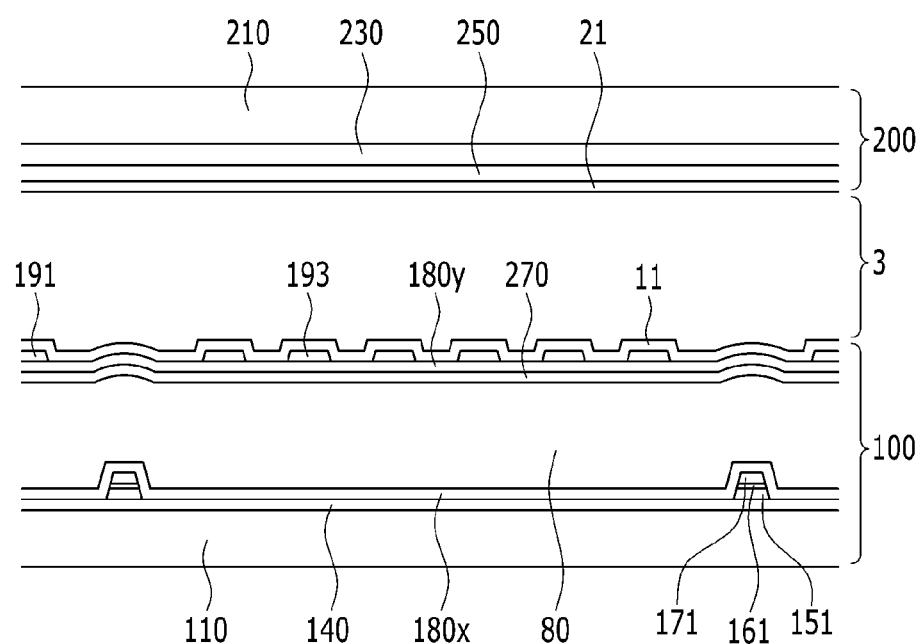
FIG. 6 is a cross-sectional view of the display device taken along line V-V of FIG. 4.
Figure 7:
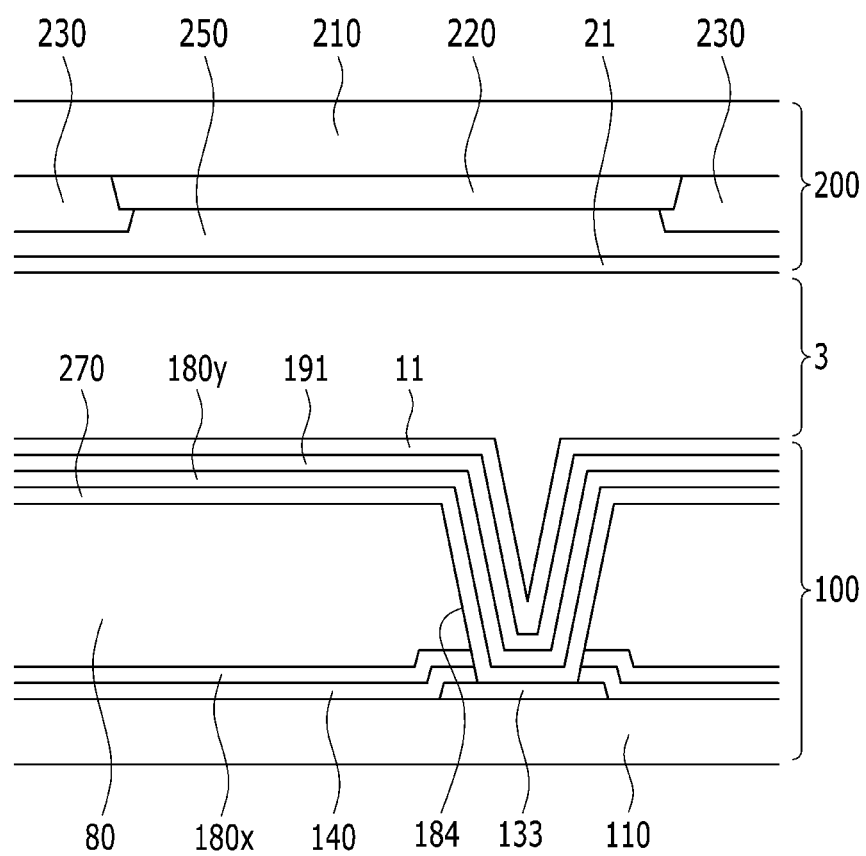
FIG. 7 is a cross-sectional view of the display device taken along line VI-VI of FIG. 4.

Hereinafter, the display area DA of the display device will be described with reference to FIGS. 4 to 7. FIG. 4 is a plan view of one pixel of the display device according to the exemplary embodiment of the invention, FIG. 5 is a cross-sectional view of the display device taken along line IV-IV of FIG. 4, FIG. 6 is a cross-sectional view of the display device taken along line V-V of FIG. 4, and FIG. 7 is a cross-sectional view of the display device taken along line VI-VI of FIG. 4.

Referring to FIGS. 4 to 7, the display device according to the exemplary embodiment of the invention includes a lower display panel 100 and an upper display panel 200 which face each other and a liquid crystal layer 3 located between the two display panels 100 and 200.

First, the lower display panel 100 will be described.

The first insulating substrate 110 includes the display area DA, the peripheral area, and the test area. Hereinafter, the pixel TFT element provided in the display area DA will be described.

First, a gate conductor including the gate line 121 and the common voltage line 131 is disposed on the first insulating substrate 110.

The gate line 121 transfers the gate signal and mainly extends in a horizontal direction. Each of the gate lines 121 includes a plurality of gate electrodes 124. Further, the gate line 121 has a wide area and further includes a gate pad part (not illustrated) contacting an ohmic contact to transfer the signal to the gate line 121.

The common voltage line 131 extends in parallel with the gate line 121 and includes an extension 133.

The gate insulating layer 140 is disposed on the gate line 121 and the common voltage line 131. The gate insulating layer 140 may include an inorganic insulating material, such as silicon nitride (SiNx) and silicon oxide (SiOx).

A plurality of pixel semiconductor layers 151 and 154 is disposed on the gate insulating layer 140. In another exemplary embodiment, the pixel semiconductor layer 154 may be disposed only on the gate electrode 124. In an exemplary embodiment, the pixel semiconductor layers 151 and 154 may include an oxide semiconductor.

The plurality of ohmic contacts 161, 163 and 165 may be disposed on the pixel semiconductor layer 154. The ohmic contacts 163 and 165 are provided as a pair, facing each other based on the gate electrode 124 and are disposed on the pixel semiconductor layer 154. The ohmic contacts 161, 163 and 165 may include a material such as n+ hydrogenated amorphous silicon doped with high-concentration n-type impurity such as phosphorous or may include silicide. However, when the pixel semiconductor layer 154 includes the oxide semiconductor, the ohmic contacts may be omitted.

The data conductor including the plurality of data lines 171 and the plurality of drain electrodes 175 is disposed on the pixel semiconductor layer 154.

The data line 171 transfers a data signal and mainly extends in a vertical direction in a plan view to intersect the gate line 121. The data conductor includes a plurality of source electrodes 173 which extend toward the gate electrode 124. In an exemplary embodiment, the data line 171 may extend straightly. However, the invention is not limited thereto, and the data line 171 may be periodically bent with an oblique angle with respect to an extending direction of the gate line 121. In an exemplary embodiment, the oblique angle of the data line 171 with respect to the extending direction of the gate line 121 may be equal to or larger than about 45 degrees (°), for example.

The drain electrode 175 includes a bar-shaped end facing the source electrode 173 with reference to the gate electrode 124 and the other end having a wide area.

The gate electrode 124, the source electrode 173, and the drain electrode 175 provide the pixel TFT which is the switching element, along with the pixel semiconductor layer 154. A linear semiconductor layer 154 may have substantially the same plane shape with the data line 171, the drain electrode 175 and the ohmic contact 165 under the drain electrode 175, except for the pixel semiconductor layer protrusion 154 in which the TFT is located.

The first passivation layer 180x is disposed on the data conductors 171 and 175 and the exposed pixel semiconductor layer 154, and may include an organic insulating material, an inorganic insulating material, or the like.

An organic insulating layer 80 may be disposed on the first passivation layer 180x, but the invention is not limited thereto, and the organic insulating layer 80 may be omitted in another exemplary embodiment of the invention The plurality of pixel common electrodes 270 is disposed on the first passivation layer 180x. In an exemplary embodiment, the pixel common electrode 270 may include the transparent conductive materials, such as ITO and IZO, for example. The pixel common electrode 270 which is a planar type may be disposed on the whole surface of the substrate 110 in an integrated plate, and an opening 273 which is located in an area corresponding to the circumference of the drain electrode 175 may be defined in the pixel common electrode 270.

A first contact hole 184 (refer to FIG. 4 and FIG. 7) through which the extension 133 of the common voltage line 131 is exposed is defined in the gate insulating layer 140 and the first passivation layer 180x.

The pixel common electrode 270 may be physically and electrically connected to the common voltage line 131 through the first contact hole 184.

In this case, the pixel common electrode 270 is provided simultaneously with the TEG common electrode 276 (refer to FIG. 3), and the pixel common electrode 270 may be connected to the TEG common electrode 276 through the main connection part 491 (refer to FIG. 3). The main connection part 491 may also be provided along with the pixel common electrode 270 and the TEG common electrode 276.

That is, the main connection part 491 connects the pixel common electrode 270 to the TEG common electrode 276 as illustrated in FIG. 3, the pixel common electrode 270 is connected to the common voltage line 131 through the contact hole 184 as illustrated in FIG. 4, thereby the TEG common electrode 276 may also be electrically connected to the common voltage line 131 via the main connection part 491.

However, the invention is not limited thereto, but according to another exemplary embodiment of the invention, the TEG common electrode 276 may be connected to the common voltage line 131 through a bridge 196. This will be described below referring to FIG. 8.

The second passivation layer 180y is disposed on the pixel common electrode 270. The second passivation layer 180y may include an organic insulating material, an inorganic insulating material, or the like.

A pixel electrode 191 is disposed on the second passivation layer 180y. The pixel electrode 191 includes a plurality of first branch electrodes 193 which generally extend in parallel with each other and are spaced apart from each other, and lower and upper horizontal parts 192 which connect upper and lower ends of the plurality of first branch electrodes 193. The first branch electrode 193 of the pixel electrode 191 may be bent along the data conductor. However, the invention is not limited thereto, and the data conductor and the first branch electrode 193 of the pixel electrode 191 may extend straightly in another exemplary embodiment. In an exemplary embodiment, the pixel electrode 191 may include transparent conductive materials, such as ITO and IZO, for example.

A plurality of second contact holes 183 through which a portion of the drain electrode 175 is exposed is defined in the first passivation layer 180x and the second passivation layer 180y, and the pixel electrode 191 is electrically connected to the drain electrode 175 through the second contact hole 183 to be applied with a data voltage. The pixel electrode 191 applied with the data voltage generates an electric field in the liquid crystal layer 3, along with the pixel common electrode 270 applied with the common voltage.

The first branch electrode 193 of the pixel electrode 191 overlaps the pixel common electrode 270 of a planar type.

The first alignment layer 11 is applied on an inside of the lower display panel 100 and may be hardened and rubbed. Predetermined static electricity may occur during the rubbing process.

Next, the upper display panel 200 will be described.

A light blocking member 220 is disposed on a second insulating substrate 210 including transparent glass, plastic, or the like. The light blocking member 220 is also referred to as a black matrix and prevents light from leaking.

Further, a plurality of color filters 230 is disposed on the second insulating substrate 210.

An overcoat 250 is disposed on the color filter 230 and the light blocking member 220. The overcoat 250 may include an (organic) insulating material and prevents the color filter 230 from being exposed and provides a flat surface. The overcoat 250 may be omitted.

A second alignment layer 21 may be disposed on the overcoat 250. The first alignment layer 11 and the second alignment layer 21 may be a horizontal alignment layer.

The liquid crystal layer 3 interposed between the lower display panel 100 and the upper display panel 200 includes a liquid crystal molecule (not illustrated), in which the liquid crystal molecule may be aligned so that a major axis thereof is horizontal to surfaces of the two display panels 100 and 200 in a state in which no electric field is present.

An outside of the substrate 110 of the lower display panel 100 may be further provided with a light unit (not illustrated) which generates light and provides the light to the two display panels 100 and 200.

The pixel electrode 191 applied with the data voltage generates an electric field in the liquid crystal layer 3 along with the pixel common electrode 270 applied with the common voltage, thereby determining the orientation of the liquid crystal molecule of the liquid crystal layer 3 and displaying the corresponding image.

The peripheral area in which the TEG TFT 410 is provided, in particular, the test area may be removed by the manufacturing process of the display device. When the test area is removed, the TEG pattern 400 is also removed. In this case, a portion of the main connection part 491 connecting the TEG common electrode 276 to the pixel common electrode 270 may remain on the substrate, and for example, the bridge 196 (refer to FIG. 8) may remain thereon.

As described above, the pixel TFT and the TEG TFT located in the display area DA and the test area TA may be simultaneously provided by the same process and to evaluate the performance and characteristics of the pixel TFT located in the display area DA, the TEG TFT element provided in the TEG pattern may be evaluated. By doing so, the performance and characteristics of the element may be evaluated without affecting the display area DA. In particular, since the TEG pattern including the TEG common electrode is not affected by static electricity, and the like, the TEG pattern may be reliably evaluated after the rubbing of the alignment layer in which the static electricity may occur.

The exemplary embodiment of the invention as described above describes that any one of the pixel electrode and the common electrode has a plate shape and the other includes the plurality of branch electrodes, but the invention is not limited thereto and therefore may be applied to all other types of liquid crystal displays in which the pixel electrode and the common electrode are disposed on one substrate.

Further, the exemplary embodiment of the invention as described above describes the liquid crystal display ("LCD") in which the pixel electrode and the common electrode overlap each other, having the insulating layer therebetween, but the invention is not limited thereto, and therefore may be applied to all other types of liquid crystal displays in which the pixel electrode and the common electrode are disposed on one substrate.

The manufacturing method of the display device according to the exemplary embodiment of the invention will be described with reference to FIGS. 1 to 7 described above.

First, the metal layer is stacked on the first insulating substrate 110 and the gate conductor including the common voltage line 131, the TEG gate electrode 126, the gate electrode 124, and the gate line 121 is provided by a photolithography process.

According to the exemplary embodiment of the invention, the gate wire is provided in a single layer, but the invention is not limited thereto, and the gate wire may be provided in a double layer. In this case, the lower metal layer may include any one selected from aluminum (Al) and aluminum neodymium (AlNd) and the upper metal layer may include molybdenum (Mo), for example.

Next, the gate insulating layer 140 is disposed on the gate conductor by a chemical vapor deposition ("CVD") method. In this case, for example, silane gas ($SiH_4$), hydrogen gas ($H_2$), nitrogen gas ($NH_3$), and the like are supplied inside a CVD chamber providing the gate insulating layer 140.

Next, source gas including $SiF_4$ gas, $SiH_4$ gas, and the like is supplied inside the CVD chamber to provide the TEG semiconductor layer 156 and the pixel semiconductor layer 154.

Next, a conductive layer is stacked and the data conductor including the data line 171, the source electrode 173, the drain electrode 175, the TEG source electrode 176, and the TEG data electrode 177 is provided by the photolithography process. The drain electrode 175 and the TEG drain electrode 177 are each spaced apart from the source electrode 173 and the TEG source electrode 176, and are located on the upper portion of an opposite side of the source electrode 173 and the TEG source electrode 176 based on the gate electrode 124 and the TEG gate electrode 126.

In this case, the providing the TEG semiconductor layer 156 and the pixel semiconductor layer 154 and the providing the data conductor including the TEG source electrode, the TEG drain electrode, the source electrode, the drain electrode, and the data line may be performed using one mask.

Next, the first passivation layer 180x and the organic insulating layer 80 are provided to cover the exposed semiconductor layers 154 and 156 and then the common electrode conductor is stacked.

The pixel common electrode 270 is provided in the display area DA and the TEG common electrode 276 is provided in the test region, by etching the stacked common electrode conductor. In this case, as illustrated in FIG. 3, the TEG connection part 492 connecting between the neighboring TEG common electrodes 276 and the main connection part 491 connecting the pixel common electrode 270 to the TEG common electrode 276 may be provided.

The pixel common electrode 270 may contact the common voltage line 131 through the contact hole 184, and the TEG common electrode 276 connected to the pixel common electrode 270 may be electrically connected to the common voltage line 131.

According to another exemplary embodiment of the invention, the TEG common electrode 276 may be electrically connected to the common voltage line 131 through a bridge 196 provided simultaneously with the pixel electrode 191. This will be described below.

Next, the second passivation layer 180y and the pixel electrode 191 are provided and the first alignment layer 11 may be provided by applying, hardening, and rubbing the alignment layer on the pixel electrode 191.

The gate electrode 124, the source electrode 173, and the drain electrode 175 which are located in the display area DA provide the pixel TFT along with the pixel semiconductor layer 154. In addition, the TEG gate electrode 126, the TEG source electrode 176, and the TEG drain electrode 177 which are located in the peripheral area provide the TEG TFT 410 along with the TEG semiconductor layer 156 and the plurality of TEG TFTs 410 provide the TEG pattern 400 along with the TEG common electrode 276.

According to the exemplary embodiment of the invention, the TEG pattern 400 may be provided in plural, and the plurality of TEG patterns 400 is spaced apart from each other at a predetermined distance.

The TEG pattern 400 is provided in the test area TA and the test area TA may be removed during the manufacturing process of the display device. Therefore, when the test area including the TEG pattern 400 is removed, a portion of the main connection part 491 connecting the pixel common electrode 270 to the TEG common electrode 276 may remain in the display device. In another example, the bridge 196 may remain in the display device.

The TEG TFT manufactured by the manufacturing method as described above is not affected by static electricity occurring by the rubbing process of the alignment layer and thus may be appropriate to evaluate the performance of the pixel TFT located in the display area DA.

Figure 8:
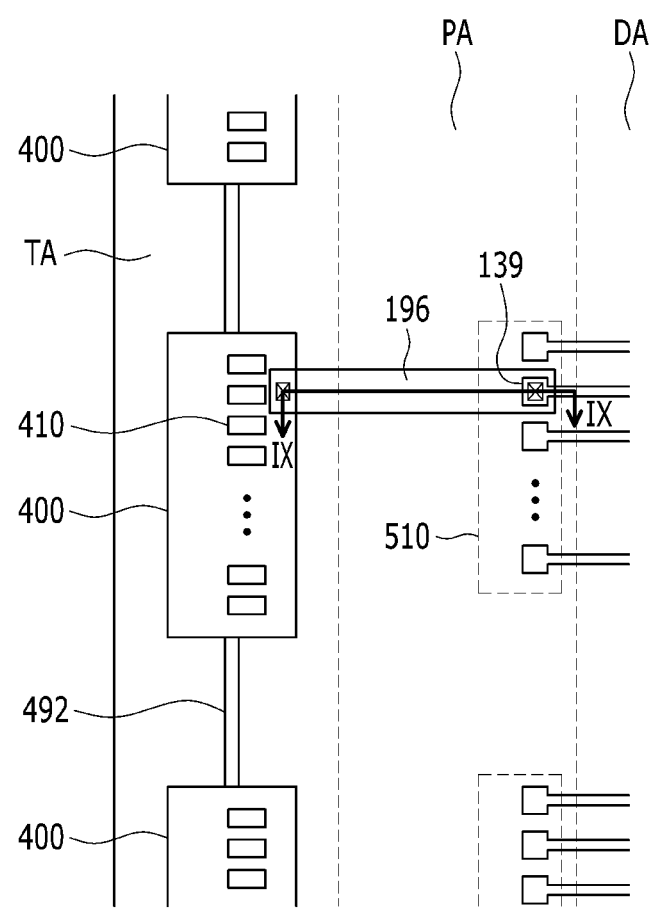
FIG. 8 is an enlarged view of another exemplary embodiment of a portion of a display device according to the invention.
Figure 9:
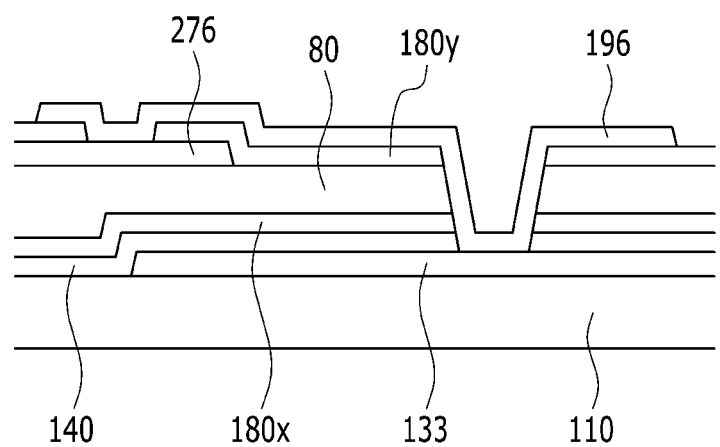
FIG. 9 is a cross-sectional view of the display device taken along line IX-IX of FIG. 8.

The display device according to another exemplary embodiment of the invention will be described in detail with reference to FIGS. 8 and 9. FIG. 8 is an enlarged view of a part of a display device according to another exemplary embodiment of the invention and FIG. 9 is a cross-sectional view of the display device taken along line IX-IX of FIG. 8. The description of the same or similar components as or to the foregoing components will be omitted.

According to another exemplary embodiment of the invention, the pixel common electrode 270 and the TEG common electrode 276 may be electrically connected through the bridge 196 provided simultaneously with the pixel electrode 191.

According to the exemplary embodiment of the invention, the pixel common electrode 270 and the TEG common electrode 276 are physically connected to each other through the main connection part 491 provided simultaneously with the pixel common electrode 270 and the TEG common electrode 276, but according to another exemplary embodiment of the invention, the pixel common electrode 270 and the TEG common electrode 276 are electrically connected to each other through another main connection part simultaneously provided with the pixel electrode 191, that is, the bridge 196.

Referring to in detail FIGS. 8 and 9, the second passivation layer 180y is disposed on the pixel common electrode 270 the TEG common electrode 276.

Next, the pixel electrode 191 is disposed on the second passivation layer 180y. In this case, the bridge 196 is provided simultaneously with the pixel electrode 191. The bridge 196 contacts the TEG common electrode 276 through the contact hole of the second passivation layer 180y and contacts the pad part 139 through the contact hole providing the opening for the pad part 139 of the common voltage line.

That is, the TEG common electrode 276 may be electrically connected to the pad part 139 of the common voltage line 131 through the bridge 196 and the pixel common electrode 270 is electrically connected to the extension 133 of the common voltage line through the opening. Therefore, the TEG common electrode 276 and the pixel common electrode 270 may be electrically connected to each other.

In the display device according to the exemplary embodiment of the invention, the TEG common electrode 276 is directly connected to the pixel common electrode 270 and thus electrically connected to the common voltage line 131, and in the display device according to another exemplary embodiment of the invention, the TEG common electrode 276 is connected to the pad part 139 of the common voltage line through the bridge 196 and the pixel common electrode 270 contacts the extension 133 of the common voltage line and thus may be electrically connected to the extension 133.

Referring to FIG. 8, the substrate may be cut along a dotted line between the test area TA and the peripheral area PA by a laser, and the like to be able to remove the test area TA. When the test area TA is removed, the bridge 196 and the TEG pattern 400 located in the test area are removed and a portion of the bridge 196 located in the peripheral area may remain in the display device.

Hereinafter, effects of the exemplary embodiment of the invention will be described with reference to FIGS. 10A to 10D and 11. FIGS. 10A to 10D are experimental graphs of a comparative example which does not include the TEG common electrode, and FIG. 11 is a graph of element performance. Referring to FIGS. 10A to 10D and 11, y-axis represents a drain-source current Ids measured in ampere (A) and x-axis represents a gate voltage measured in volt (V).

Figure 10A:
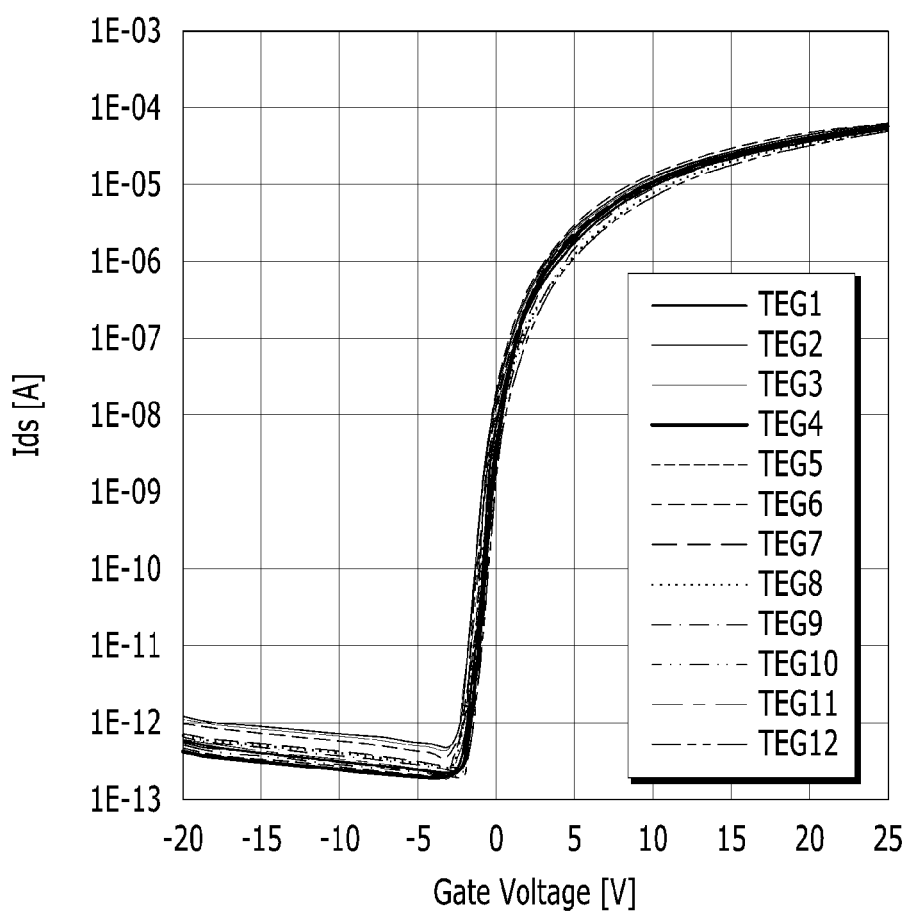
FIGS. 10A to 10D are experimental graphs of a comparative example.
Figure 11:
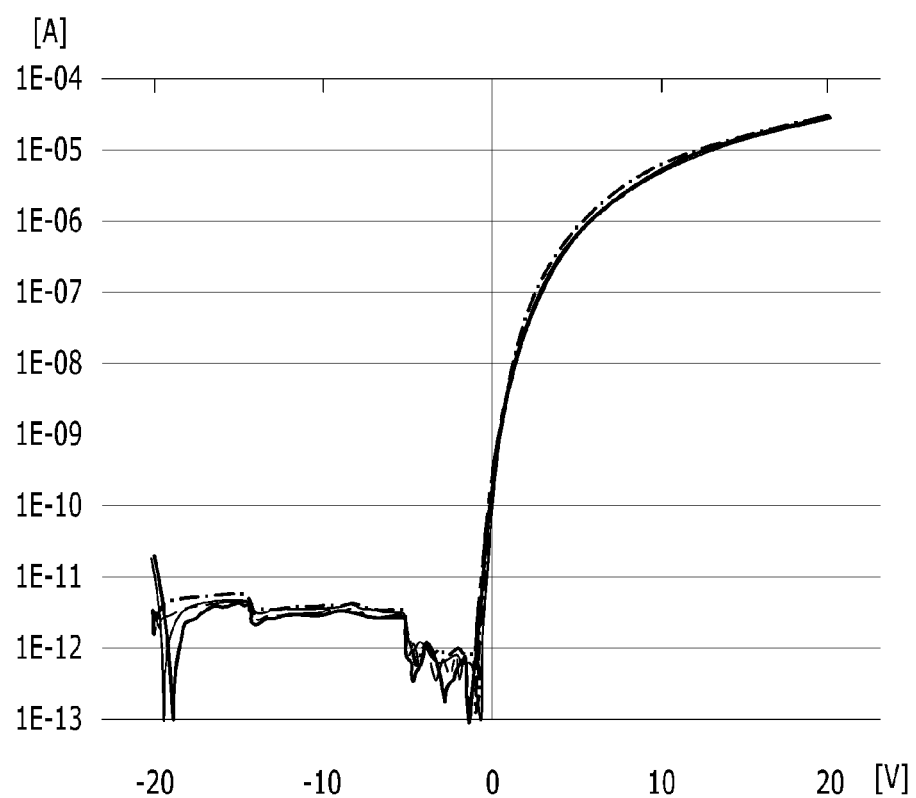
FIG. 11 is an experimental graph of the exemplary embodiment of element performance according to the invention.

FIG. 10A is a graph of the performance evaluation of the TFT performed after the TEG TFT which is a comparative example is provided. It can be appreciated from FIG. 10A that each of the TEG TFTs has substantially the constant threshold voltage value.

Figure 10B:
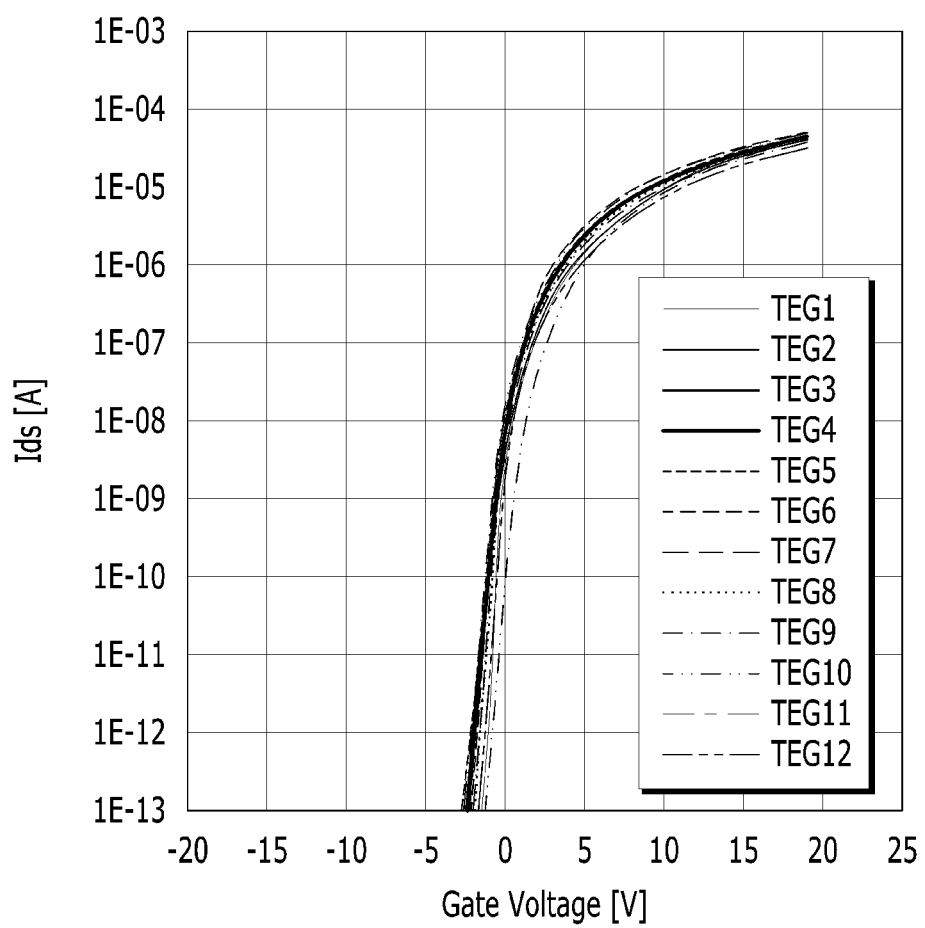
Figure 10C:
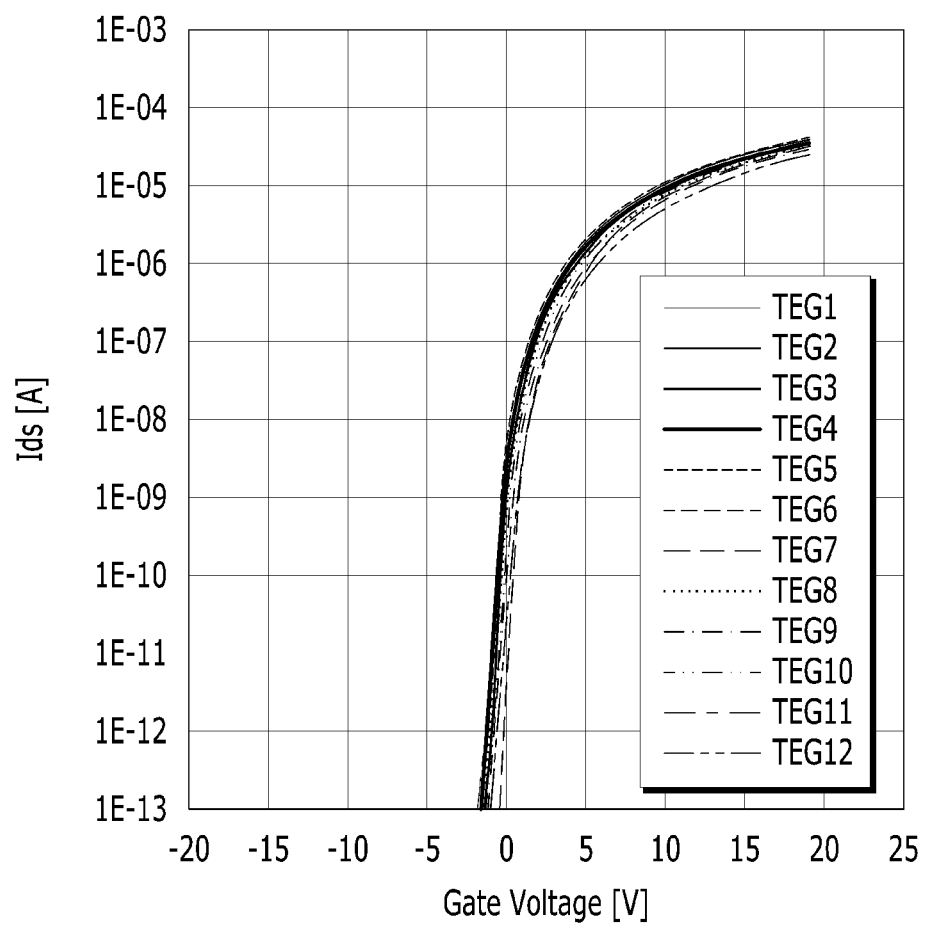

FIG. 10B is a graph of the performance evaluation of the TFT performed after the alignment layer is applied on the TEG TFT which is a comparative example, and FIG. 10C is a graph of the performance evaluation of the TFT performed after the alignment layer is applied and hardened. Referring to FIGS. 10B and 10C, it is shown that each of the TEG TFTs has substantially the constant threshold voltage value.

Figure 10D:
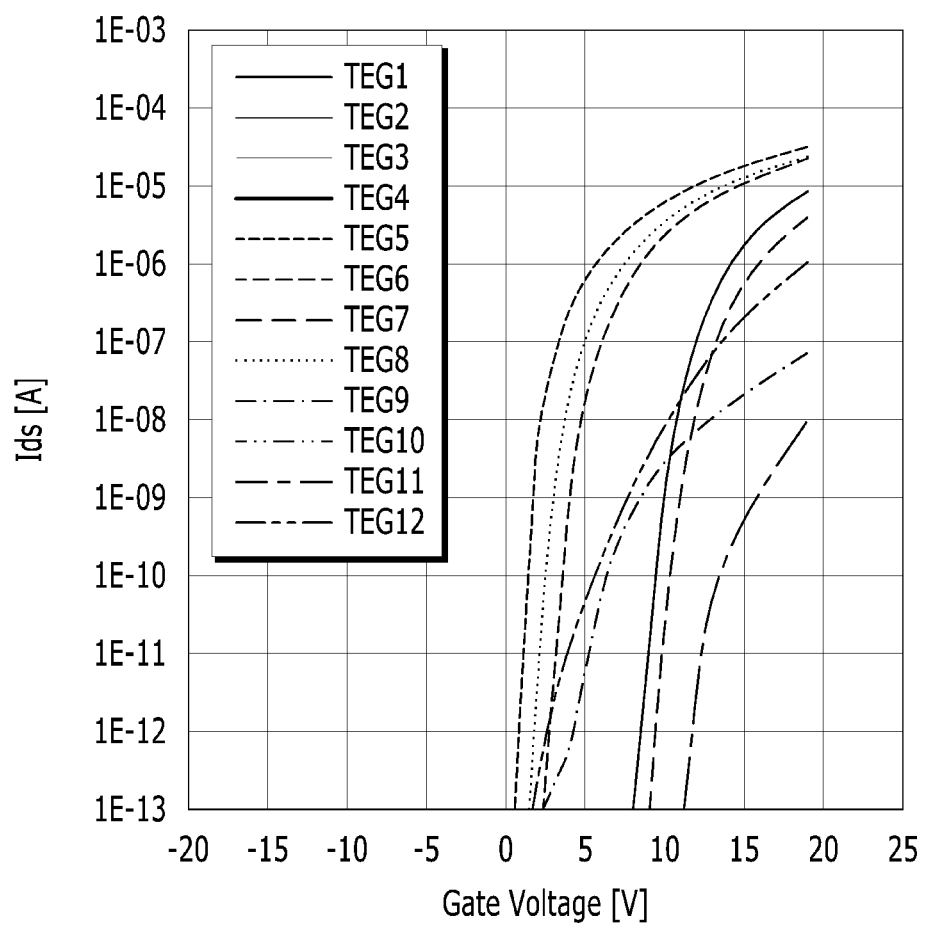

Next, FIG. 10D is a graph of the performance evaluation of the TEG TFT performed after the alignment layer is hardened and the rubbing process is performed. Referring to FIG. 10D, it is shown that after the rubbing process is performed, the threshold voltage value of the TFT moves to a positive side and the scattering of the voltage value is also considerably increased.

However, describing the characteristics evaluation of the TFT including the common electrode which undergoes the same process as FIG. 10D with reference to FIG. 11, it may be appreciated that even after the alignment layer is rubbed, the characteristics of the TFT are little changed.

That is, it can be appreciated that the TEG TFT which is provided by the same process as the pixel TFT located in the display area and provided in the test area to evaluate the performance of the pixel TFT indicates the constant characteristics even after the alignment layer is rubbed as the TEG pattern includes the TEG common electrode.

As a result, it is possible to evaluate the performance of the pixel TFT with the TEG TFT located in the test area, and in particular, it is possible to evaluate the performance even after the alignment layer is provided. Further, since the reliability of the performance evaluation is improved, it is possible to provide the excellent display device.

While this invention has been described in connection with what is presently considered to be practical exemplary embodiments, it is to be understood that the invention is not limited to the disclosed exemplary embodiments, but, on the contrary, is intended to cover various modifications and equivalent arrangements included within the spirit and scope of the appended claims.

What is claimed is:

1. A display device, comprising:
    a first insulating substrate including a display area, a peripheral area, and a test area;
    a gate conductor including a test element group gate electrode, a gate electrode, and a gate line which are disposed on the first insulating substrate;
    a gate insulating layer disposed on the gate conductor;
    a semiconductor layer including a test element group semiconductor layer and a pixel semiconductor layer which are disposed on the gate insulating layer;
    a data conductor including a test element group source electrode, a test element group drain electrode, a data line including a source electrode, and a drain electrode which are disposed on the semiconductor layer;
    a first passivation layer disposed on the data conductor;
    a test element group common electrode and a pixel common electrode which are disposed on the first passivation layer;
    a second passivation layer disposed on the test element group common electrode and the pixel common electrode; and
    a pixel electrode disposed on the second passivation layer.

2. The display device of claim 1, wherein:
    the gate electrode, the pixel semiconductor layer, the source electrode, and the drain electrode provide a pixel thin film transistor,
    the test element group gate electrode, the test element group semiconductor layer, the test element group source electrode, and the test element group drain electrode provide a test element group thin film transistor, and
    the test element group thin film transistor and the test element group common electrode provide a test element group pattern.

3. The display device of claim 2, wherein:
    the pixel thin film transistor is located in the display area which displays an image, and
    the test element group thin film transistor is located in the test area which is located around the display area.

4. The display device of claim 2, further comprising
    a plurality of test element group patterns, and
    wherein the plurality of test element group patterns is connected to each other through a test element group connection part which connects neighboring test element group common electrodes of the plurality of test element group patterns.

5. The display device of claim 4, wherein:
    the gate conductor further includes a common voltage line, and
    the pixel common electrode and the test element group common electrode are electrically connected to the common voltage line.

6. The display device of claim 5, further comprising:
    a main connection part connecting the pixel common electrode to the test element group common electrode.

7. The display device of claim 6, further comprising
    a separation line between the test area in which the test element group thin film transistor is located and the peripheral area, and at which the test area is removed to maintain a portion of the main connection part connecting the TEG common electrode to the display area or the peripheral area.

8. The display device of claim 5, further comprising:
    a bridge disposed on the second passivation layer,
    wherein the bridge contacts the test element group common electrode and the common voltage line.

9. The display device of claim 1, further comprising:
    a first alignment layer disposed on the pixel electrode,
    wherein the first alignment layer includes a rubbed portion.

10. A manufacturing method of a display device, the method comprising:
    providing a gate conductor including a gate electrode, a test element group gate electrode, and a gate line on a first insulating substrate including a display area, a peripheral area, and a test area;
    disposing a gate insulating layer on the gate conductor;
    disposing a test element group semiconductor layer and a pixel semiconductor layer on the gate insulating layer;
    disposing a data conductor including a test element group source electrode, a test element group drain electrode, a source electrode, a drain electrode, and a data line on the test element group semiconductor layer and the pixel semiconductor layer;
    disposing a first passivation layer on the data conductor;
    disposing a test element group common electrode and a pixel common electrode on the first passivation layer;
    disposing a second passivation layer on the test element group common electrode and the pixel common electrode; and
    disposing a pixel electrode on the second passivation layer.

11. The manufacturing method of claim 10, wherein:
    the test element group gate electrode, the test element group semiconductor layer, the test element group source electrode, and the test element group drain electrode provide a test element group thin film transistor,
    the gate electrode, the pixel semiconductor layer, the source electrode, and the drain electrode provide a pixel thin film transistor,
    the test element group thin film transistor and the test element group common electrode provide a plurality of test element group patterns.

12. The manufacturing method of claim 11, wherein:
    the plurality of test element group patterns is connected to each other through a test element group connection part which connects neighboring test element group common electrodes of the plurality of test element group patterns.

13. The manufacturing method of claim 11, wherein:
    the plurality of test element group patterns is spaced apart from each other at a predetermined distance.

14. The manufacturing method of claim 11, further comprising removing the test area at a separation line between the test area and the peripheral area,
  wherein the pixel thin film transistor is located in the display area which displays an image, and
  the test element group pattern is located in the test area which is disposed around the display area.

15. The manufacturing method of claim 14, wherein:
  in the removing the test area, a portion of the main connection part connecting the test element group common electrode to the display area or the peripheral area remains.

16. The manufacturing method of claim 10, further comprising:
  providing a main connection part connecting the pixel common electrode to the test element group common electrode.

17. The manufacturing method of claim 16, wherein:
  the gate conductor further includes a common voltage line, and
  the pixel common electrode and the test element group common electrode are electrically connected to the common voltage line.

18. The manufacturing method of claim 17, wherein
  a bridge is further provided in the providing the pixel electrode, and
  the bridge contacts the test element group common electrode and the common voltage line.

19. The manufacturing method of claim 10, further comprising:
  applying and rubbing an alignment layer on the pixel electrode.

20. The manufacturing method of claim 10, wherein:
  the providing the data conductor including the test element group source electrode, the test element group drain electrode, the source electrode, the drain electrode, and the data line on the test element group semiconductor layer and the pixel semiconductor layer is performed using a single mask.

* * * * *